United States Patent
Cranford, Jr. et al.

(10) Patent No.: US 10,250,010 B1
(45) Date of Patent: Apr. 2, 2019

(54) CONTROL OF VCSEL-BASED OPTICAL COMMUNICATIONS SYSTEM

(71) Applicants: GLOBALFOUNDRIES INC., Grand Cayman (KY); International Business Machines Corporation, Armonk, NY (US)

(72) Inventors: Hayden C. Cranford, Jr., Cary, NC (US); Rashmi R. Bindu, Raleigh, NC (US); Jonathan E. Proesel, Mount Vernon, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/982,459

(22) Filed: May 17, 2018

(51) Int. Cl.
- H04B 10/04 (2006.01)
- H01S 5/026 (2006.01)
- H01S 5/183 (2006.01)
- H04B 10/69 (2013.01)
- H04B 10/564 (2013.01)

(Continued)

(52) U.S. Cl.
CPC .......... *H01S 5/0264* (2013.01); *H01S 5/0683* (2013.01); *H01S 5/183* (2013.01); *H04B 10/503* (2013.01); *H04B 10/564* (2013.01); *H04B 10/6973* (2013.01)

(58) Field of Classification Search
CPC ............... H04B 10/40; H04B 10/2504; H04B 10/50593; H04B 10/50572; H04B 10/6932; H04B 10/5057; H04B 10/0795; H04B 10/07953; H04B 10/07955; H04B 10/572; H04B 10/564

USPC ..... 398/135, 136, 137, 138, 139, 33, 38, 26, 398/27, 192, 193, 194, 195, 196, 197, 398/158, 159, 202, 208, 209, 198; 372/32, 34, 36, 38.02

See application file for complete search history.

(56) References Cited

U.S. PATENT DOCUMENTS

| 5,285,466 A | 2/1994 | Tabatabaie |
| 6,016,326 A | 1/2000 | Claisse et al. |

(Continued)

OTHER PUBLICATIONS

U.S. Appl. No. 15/686,304, Office Action dated Jan. 24, 2019, 14 pages.

*Primary Examiner* — Hanh Phan
(74) *Attorney, Agent, or Firm* — David Cain; Hoffman Warnick LLC

(57) ABSTRACT

Methods according to the disclosure include methods for controlling an optical communications system. The method may include adjusting a VCSEL transmitter of the optical communications system to operate at a second data bandwidth distinct from its first data bandwidth; reducing a data flow rate of a receiver during operation of the optical communications system at the second data bandwidth; determining whether a system quality metric for the receiver meets a specification requirement; in response to determining the system quality metric does not meet the specification requirement, adjusting an operational setting of the VCSEL transmitter or the receiver; in response to determining the system quality metric meets the specification requirement, continuing operation of the optical communications system at the second data bandwidth; and in response to receiving an override signal, resuming operation of the optical communications system at the first data bandwidth.

20 Claims, 5 Drawing Sheets

(51) Int. Cl.
*H04B 10/50* (2013.01)
*H01S 5/0683* (2006.01)

(56) References Cited

U.S. PATENT DOCUMENTS

| | | |
|---|---|---|
| 8,971,362 B2 | 3/2015 | Smith et al. |
| 2004/0022544 A1* | 2/2004 | Case ................ H04B 10/40 398/137 |
| 2004/0228377 A1 | 11/2004 | Deng et al. |
| 2009/0310867 A1 | 12/2009 | Bogdan et al. |
| 2010/0150567 A1* | 6/2010 | Kondo ................ H04B 10/40 398/137 |
| 2013/0266326 A1 | 10/2013 | Joseph et al. |
| 2015/0318666 A1 | 11/2015 | Hammar et al. |
| 2015/0340841 A1 | 11/2015 | Joseph |

\* cited by examiner

US 10,250,010 B1

CONTROL OF VCSEL-BASED OPTICAL COMMUNICATIONS SYSTEM

BACKGROUND

Technical Field

The present disclosure relates to the control of optical communications systems. More specifically, the present disclosure relates to methods for controlling optical communications systems with vertical cavity surface emitting laser (VCSEL) technology. Optical communications systems may include VCSEL-based transmitters for sending light-encoded signals, and receivers for detecting the light and interpreting the signals.

Related Art

In the art of integrated circuit (IC) technology and signal processing, optical communications systems may transmit various forms of data at high speeds. As compared to other architectures for transmitting signals between various nodes of a system, device, etc., optical transmission systems may rely upon light-emitting devices (e.g., photodiodes) to relay information at higher speeds than may be available through digital circuitry. One type of photodiode transmitter configured for use in an optical transmission system is a "vertical cavity surface emitting laser (VCSEL)." In this context, the term "laser" in the acronym VCSEL may refer to the diode emitter rather than the beams of light provided by the diode emitter. A typical optical transmission system may include multiple (e.g., hundreds, thousands, millions, etc.) of individual VCSELs.

FIG. 1 provides a cross-sectional view of a typical VCSEL transmitter 10 configured for use in an optical transmission system. VCSEL transmitter 10 may be positioned on and configured for use with a larger IC structure incorporating various types of electronic circuits. Thus, VCSEL transmitter 10 may include a metal contact 12 positioned beneath a substrate 14 composed of one or more semiconductor materials, e.g., to provide a structural and electrical interface between metal contact 12 and the remainder of VCSEL transmitter 10. VCSEL transmitter 10 may also include, e.g., a lower Bragg reflector 16 and an upper Bragg reflector 18 structured to create a quantum well at the physical interface therebetween. A Bragg reflector refers to any type of optical reflector structured for use with optical fibers and/or other waveguides, and may include multiple layers with varying refractive index stacked in an alternating fashion (e.g., as provided through lower and upper Bragg reflectors 16, 18). Such arrangements of materials induce periodic variation in the effective refractive index of the device. An emitter contact 20 may be positioned on an upper surface of upper Bragg reflector 18, and may have a cavity 22 therein. By action of electrical principles known in the art and beyond the scope of this disclosure, transmitting an electrical current and signal to Bragg reflectors 16, 18 through metal contact 10 may cause laser beam(s) 24 to be emitted from cavity 22 of VCSEL transmitter 10.

Laser beam(s) 24 may be transmitted to other components, e.g., one or more receiver(s) 50, by being transmitted through a light transfer medium (not shown) such as an optical fiber or similar structure. Receiver(s) 50 may be positioned on a device at a location that is remote from VCSEL transmitter(s) 10. The variable distance between VCSEL transmitter(s) 10 and receiver(s) 50 is shown in FIG. 1 by a phantom line and broken edges within laser beam 24. Each receiver 50 may be configured to detect laser beam(s) 24 produced by VCSEL transmitter(s) 10 and decode signals for transmission to other components.

Optical communications systems incorporating multiple VCSEL transmitters 10 may effectively send and receive large amounts of data at high speeds during the operation of an optical communications system. Notwithstanding the inherent advantages and features of optical communications architecture, optical communications systems which rely upon VCSEL transmitters 10 may have limitations. For instance, VCSEL transmitters 10 may exhibit relatively high power consumption as compared to other laser emitting devices. Underlying causes of power consumption in a VCSEL-based system may include, the impracticability of turning VCSEL transmitters 10 completely off due to the ensuing delays in data transmission when the device must be turned on. The need for a constant power supply to VCSEL transmitters 10, in turn, may contribute to heating and aging of a device with VCSEL transmitters 10 therein. It is possible to reduce the bandwidth of a device which uses VCSEL transmitters 10 to reduce power consumption and heat accumulation during periods of reduced demand. Conventional methodologies for providing lower-bandwidth functionality have been limited to only the transmission side, i.e., adjusting the operation of VCSEL transmitter(s) 10.

SUMMARY

A first aspect of the disclosure provides a method for controlling an optical communications system operating at a first data bandwidth, the optical communications system having a vertical cavity surface emitting laser (VCSEL) transmitter and a receiver for detecting lasers from the VCSEL transmitter, the method including: adjusting the VCSEL transmitter of the optical communications system to operate at a second data bandwidth distinct from the first data bandwidth; reducing a data flow rate of the receiver during operation of the optical communications system at the second data bandwidth; determining whether a system quality metric for the receiver meets a specification requirement during operation of the optical communications system at the second data bandwidth, wherein the system quality metric comprises one of a bit error rate of the receiver, a power consumption of the receiver, or an optical modulation amplitude of the VCSEL transmitter; in response to determining the system quality metric does not meet the specification requirement, adjusting an operational setting of the VCSEL transmitter or the receiver; in response to determining the system quality metric meets the specification requirement, continuing operation of the optical communications system at the second data bandwidth; and in response to receiving an override signal from a control node of the optical communications system, resuming operation of the optical communications system at the first data bandwidth.

A second aspect of the disclosure provides a computer program product stored on a computer readable storage medium, the computer program product including program code, which, when being executed by at least one computing device, causes the at least one computing device to: operate an optical communications system at a first data bandwidth, the optical communications system having a vertical cavity surface emitting laser (VCSEL) transmitter and a receiver for detecting lasers from the VCSEL transmitter; adjust the VCSEL transmitter of the optical communications system to operate at a second data bandwidth distinct from the first data bandwidth; reduce a data flow rate of the receiver during operation of the optical communications system at the second data bandwidth; determine whether a system quality metric for the receiver meets a specification requirement during operation of the optical communications system at the second data bandwidth, wherein the system quality metric comprises one of a bit error rate of the receiver, a power consumption of the receiver, or an optical modulation amplitude of the VCSEL transmitter; in response to determining the system quality metric does not meet the specification requirement, adjusting an operational setting of the VCSEL transmitter or the receiver; in response to determining the system quality metric meets the specification requirement, continuing operation of the optical communications system at the second data bandwidth; and in response to receiving an override signal from a control node of the optical communications system, resuming operation of the optical communications system at the first data bandwidth.

A third aspect of the present disclosure provides a system including at least one computing device configured to perform a method for controlling an optical communications system operating at a first data bandwidth, the optical communications system having a vertical cavity surface emitting laser (VCSEL) transmitter and a receiver for detecting lasers from the VCSEL transmitter, by performing actions including: adjusting the VCSEL transmitter of the optical communications system to operate at a second data bandwidth distinct from the first data bandwidth; reducing a data flow rate of the receiver during operation of the optical communications system at the second data bandwidth; determining whether a system quality metric for the receiver meets a specification requirement during operation of the optical communications system at the second data bandwidth, wherein the system quality metric comprises one of a bit error rate of the receiver, a power consumption of the receiver, or an optical modulation amplitude of the VCSEL transmitter; in response to determining the system quality metric does not meet the specification requirement, adjusting an operational setting of the VCSEL transmitter or the receiver; in response to determining the system quality metric meets the specification requirement, continuing operation of the optical communications system at the second data bandwidth; and in response to receiving an override signal from a control node of the optical communications system, resuming operation of the optical communications system at the first data bandwidth.

Figure 1:
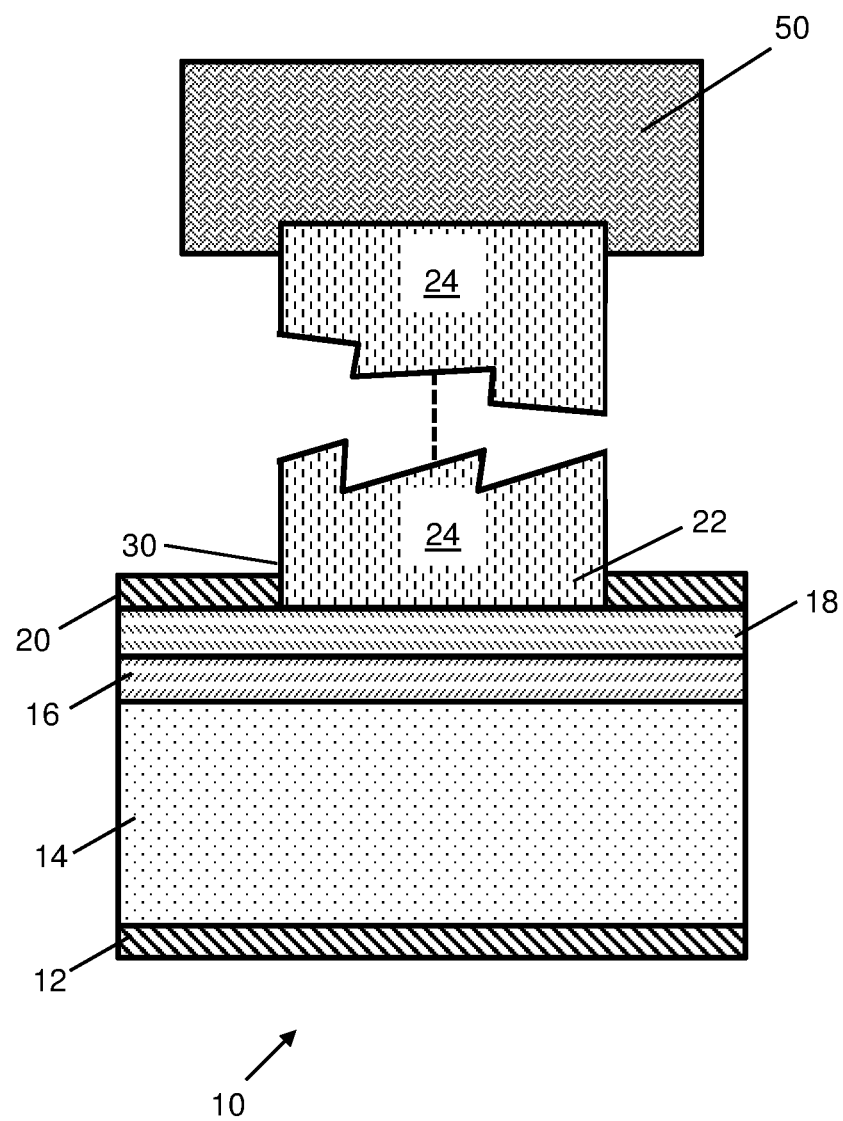
FIG. 1 provides a cross-sectional view of a conventional VCSEL transmitter and receiver configured for use in an optical communications system.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

Embodiments of the disclosure may provide operational methodologies to control optical communications systems, as well as systems, program products, etc., for implementing such methodologies. Methods according to the disclosure may include controlling an optical communications system which operates using a vertical cavity surface emitting laser (VCSEL) transmitters and receivers. The method in particular may be implemented during operation at a reduced bandwidth, e.g., to improve signal fidelity and/or power reduction when processing demands have relaxed. The method may be interconnected with data flow control techniques, e.g., processes to intentionally reduce the data bandwidth of an optical communications system during periods of reduced demand.

To better illustrate the various embodiments of the present disclosure, particular terminology which may be known or unknown to those of ordinary skill in the art is defined to further clarify the embodiments set forth herein.

The term "system" may refer to a computer system, server, etc., composed wholly or partially of hardware and/or software components, one or more instances of a system embodied in software and accessible to a local or remote user, all or part of one or more systems in a cloud computing environment, one or more physical and/or virtual machines accessed via the Internet, other types of physical or virtual computing devices, and/or components thereof. An "optical communications system" refers to a hardware infrastructure for providing telecommunication between two or more devices, entities, etc., which uses light as a medium for transmitting data. In an optical communications system, a transmitter produces an optical signal based on particular inputs, while a receiver component interprets incoming optical signals to produce an electrical signal containing the corresponding information.

The term "system quality metric" may generally refer to any descriptive or inferential variable for characterizing the operation of VCSEL transmitters and/or receivers. A system quality metric thus may include any measurement or group of measurements pertaining to the operation of VCSEL transmitters and/or receivers of an optical communications system. A system quality metric may include, for example, a bit error rate of the receiver, a power consumption of the receiver, and/or an optical modulation amplitude of the VCSEL transmitter. The term "violate" may refer to any value of a parameter which does not comply with a predetermined rule or set of rules defining acceptable value for a parameter, e.g., being below a threshold value, being above a threshold value, being outside a range of desired values, or being within at least one range of non-desired values. Conversely the term "meet" may refer to any value of a parameter which complies with a predetermined rule or rules defining acceptable value(s) for a parameter, e.g., being at or above a reference value, at or below a reference value, being within or outside a particular range of values, or being within or outside at least one range of reference values.

A "data bandwidth" refers to a measurement of transmission speed (e.g., bits per second) of a communications network, with higher data bandwidths indicating faster signal transmission through the network. A "bandwidth demand" refers to the current data transmission speed requested during operation of an optical communications system. A "minimum bandwidth" defines the lowest possible bandwidth for continued operation of the optical communications system, regardless of whether such a level of bandwidth will comply with the current "bandwidth demand" on the optical communications system.

Figure 2:
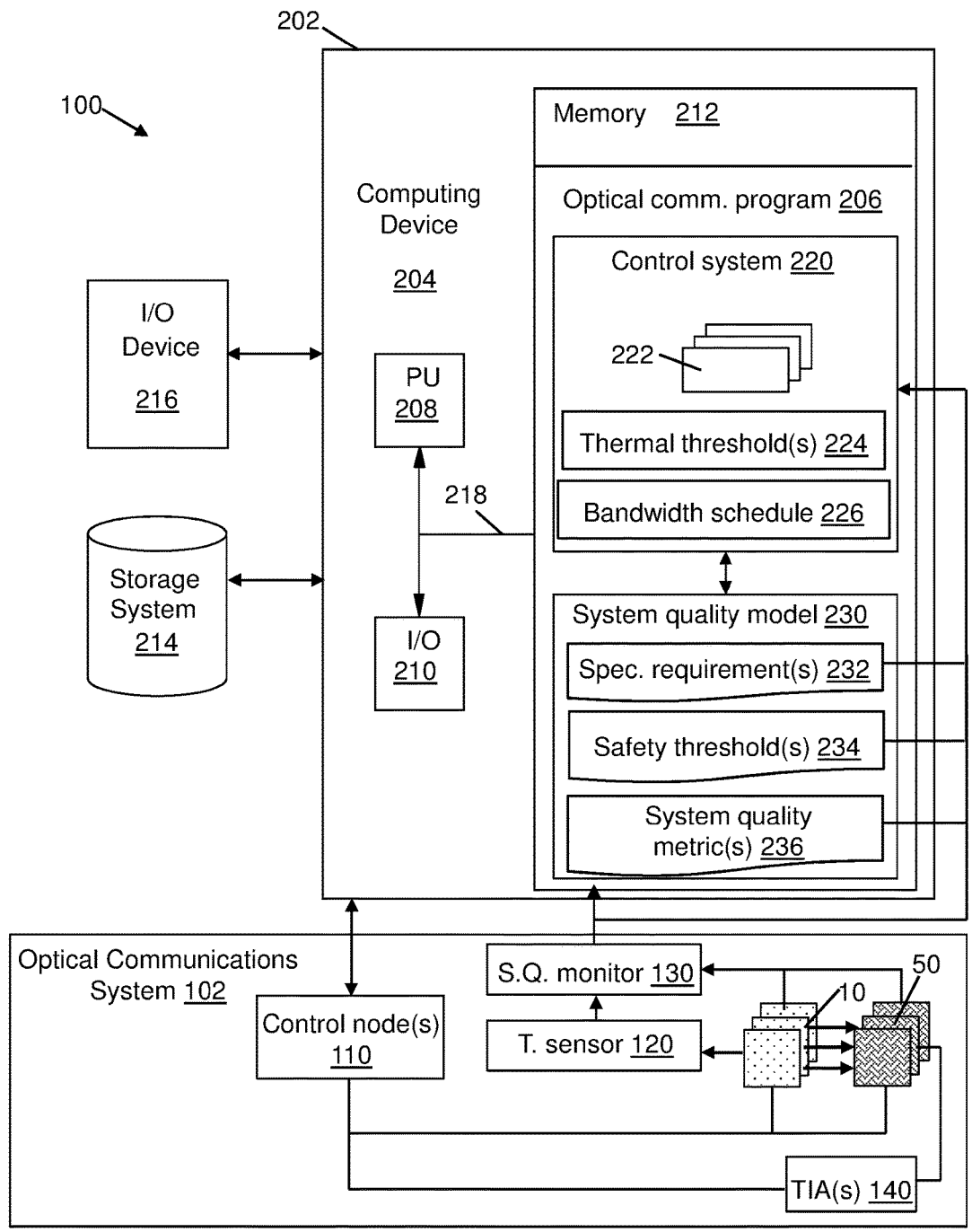
FIG. 2 depicts an illustrative environment, which includes a computer system configured to interact with an optical communications system to control an optical communications system according to embodiments of the disclosure.

Referring to FIG. 2, an illustrative environment 100 for implementing the methods and/or systems described herein is shown. Environment 100 may include at least one optical communications system 102 which includes multiple vertical cavity surface emitting laser (VCSEL) components including, e.g., VCSEL transmitter(s) 10 and receiver(s) 50 (both also depicted in FIG. 1). VCSEL transmitters 10 of optical communications system 102 may each be configured to send or receive data in the form of pulsing laser lights to affect the operation of devices communicatively connected to optical communications system 102. The hardware infrastructure of optical communications system 102 may include a group of control nodes 110 (e.g., electrical interface with external components) for controlling the operation of VCSEL transmitters 10 and/or receivers 50 based on various inputs, e.g., electrical signals, wireless signals, etc., discussed herein. Optical communications system 102 may also include one or more temperature sensors 120 for directly or indirectly measuring the temperature of optical communications system 102 during operation. Temperature sensors ("T. sensor(s)") 120 may be used to indicate the temperature of optical communications system 102 as a whole, or may be configured to measure only targeted portions of optical communications system 102. In addition, optical communications system 102 may include one or more system quality monitors 130 ("S.Q. monitor(s)") for measuring and/or otherwise quantifying one or more system quality metrics for VCSEL transmitter(s) 10 and receiver(s) 50.

System quality monitor(s) 130 may take the form of, e.g., one or more electronic circuits and/or subcomponents configured to evaluate various operating characteristics of optical communications system 102. For instance, system quality monitor 130 may be embodied as one or more logic circuits configured to detect a bit error rate, calculated as the number of bit errors for a specified interval divided by total number of bits transmitted or received during the interval. According to a further example, system quality monitor 130 may take the form of a wattmeter for measuring the power consumption of optical communications system 102 during operation. According to yet another example, system quality monitor 130 may include a signal analyzer (e.g., a spectrum analyzer, a vector signal analyzer, etc.) for measuring the amplitude of signals transmitted by VCSEL transmitter 10. One or more adjustable transimpedance amplifier(s) ("TIA(s)") 140 may also be electrically coupled between receiver(s) 50 and control node(s) 110. A transimpedance amplifier is an electrical circuit which converts an input current to an output voltage. An adjustable resistor of TIA(s) 140 may control the ratio ("voltage gain") across TIA(s) 140, thus varying the amount of output voltage produced by a given input voltage. The output voltage of TIA(s) 140 may define the data flow rate of receiver 50, i.e., the total number of bits per unit of time accepted by receiver 50. Adjusting the resistance of TIA(s) 140 may allow control node(s) 110 to adjust the data flow rate of receiver 50. Conventionally, changing the data bandwidth of optical communications system 102 will not affect the data flow rate of receiver 50, thereby reducing efficiency in the power consumption of receiver 50 at lower bandwidths. Embodiments of the disclosure may actively adjust the data flow rate of receiver 50, and/or other components of optical communications system 102, for correspondence with the current data bandwidth.

To control optical communications system 102, e.g., by manipulating VCSEL transmitter(s) 10 and/or receiver(s) 50, environment 100 may include a computer system 202 having at least one computing device 204. Computing device 204 may include, e.g., an optical communications program ("optical comm. program") 206 which may include, e.g., one or more sub-systems (control system 220 described herein) for performing any/all of the processes described herein and implementing any/all of the embodiments described herein.

Computer system 202 is shown including a processing unit (PU) 208 (e.g., one or more processors), an I/O component 210, a memory 212 (e.g., a storage hierarchy), an external storage system 214, an input/output (I/O) device 216 (e.g., one or more I/O interfaces and/or devices), and a communications pathway 218. In general, processing unit 208 may execute program code, such as optical communications program 206, which is at least partially fixed in memory 212. While executing program code, processing unit 208 processes data, which may result in reading and/or writing data from/to memory 212 and/or storage system 214. Pathway 218 provides a communications link between each of the components in environment 100. I/O component 210 may comprise one or more human I/O devices, which enable a human user to interact with computer system 202 and/or one or more communications devices to enable a system user to communicate with the computer system 202 using any type of communications link. To this extent, optical communications program 206 may manage a set of interfaces (e.g., graphical user interface(s), application program interface(s), etc.) that enable system users to interact with optical communications program 206. Further, optical communications program 206 may manage (e.g., store, retrieve, create, manipulate, organize, present, etc.) data, through several modules contained within a control system 220 (i.e., modules 222). Control system 220 is shown by example as being a sub-system of optical communications program 206. However, it is understood that control system 220 may be a wholly independent system. Memory 212 of computing device 204 is also shown to include a system quality model 230 of optical communications system 102, though it is understood that system quality model 230 may be included within one or more independent computing devices, programs, etc., in alternative embodiments.

As noted herein, optical communications program 206 may include control system 220. In this case, various modules 222 of control system 220 may enable computer system 202 to perform a set of tasks used by optical communications program 206, and may be separately developed and/or implemented apart from other portions of optical communications program 206. Memory 212 may thus include various software modules 222 of system 220 configured to perform different actions. Example modules may include, e.g., a comparator, a calculator, a determinator, etc. One or more modules 222 may use algorithm-based calculations, look up tables, software code, and/or similar tools stored in memory 212 for processing, analyzing, and operating on data to perform their respective functions. Each module discussed herein may obtain and/or operate on data from exterior components, units, systems, etc., or from memory 212 of computing device 204.

Modules 222 of control system 220 are shown to illustrate operation of computer system 202 according to various examples. Control system 220 may include, e.g., modules 222 for managing data flow in optical communications system 102. Optical communications program 206 may generate a system quality model 230 expressed, e.g., through a graphical representation, listing, and/or other organizational structure for representing various parameters or data pertaining to optical communications system 102. Control system 220 may construct and/or modify various components simulated in system quality model 230 and various forms of data included therein. For instance, control system 220 may quantify one or more metrics pertaining to the operation of optical communications system 102 (e.g., available bandwidth, current or past processes, temperature, bandwidth requirements for particular operations, etc.).

System quality model 230 may store, modify, and/or otherwise use any conceivable type of data pertaining to optical communications system 102, and particular examples are shown in FIG. 2 to better illustrate various embodiments provided herein. As shown, system quality model 230 may store, calculate, compare, etc., data including, e.g., one or more specification requirements ("spec. requirements") 234 defining the minimum value(s) of one or more system quality metrics (recorded, e.g., in a system quality metric field 236 as discussed below) pertaining to VCSEL transmitter(s) 10 and/or receivers 50 during the operation of optical communications system 102. Specification requirement(s) 232 may be defined based on the current operating situation, anticipated operating situations, past operation, manufacturer or customer settings, etc. According to examples, specification requirements 232 may include a maximum bit error rate of receiver 50, a target power consumption of receiver 50, a minimum optical modulation amplitude of VCSEL transmitter 10. Specification requirements(s) 232 may additional or alternatively define minimum values, maximum values, ranges, etc., for other variables which measure the characteristics of optical communications system 102.

System quality model 230 may also include one or more safety thresholds 234 defining preferable values for each system quality metric of optical communications system 102 under analysis. Safety thresholds 234 may be integrated into system quality model 230 to prevent optical communications system 102 from operating in a manner which risks violating specification requirements 232. For instance, where specification requirement 232 defines a maximum bit error rate of approximately $1.0 \times 10^{-13}$ errors per total number of bits, safety threshold 234 may be one order of magnitude above specification requirement 232 (e.g., approximately $1.0 \times 10^{-12}$ errors per total number of bits). The measured and/or determined system quality metrics may be recorded in a system quality metric field 236 of system quality model 230, and system quality model 230 may receive such measurements from system quality monitor 130 of optical communications system 102.

According to the disclosure, optical communications program 206 may control system 102 by causing optical communications program 206 to adjust control node(s) 110 of optical communications system 102 based on system quality model 230. Optical communications program may control optical communications system 102 through control nodes 110, e.g., through I/O device 216 and/or any other solution for placing control nodes 110 in communication with optical communications program 206. It is also understood that elements included within memory 212, e.g., optical communications program 206, control system 220, system quality model 230, etc., may include other types of parameters and/or data included therein. As an example, control system 220 may include or be provided in the form of a data bandwidth schedule 226 including a first data bandwidth, a second data bandwidth, the amount of change between predetermined data bandwidths, etc. Data bandwidth schedule 226 may additionally or alternatively provided, e.g., in system quality model 230, elsewhere in memory 212, and/or through other components communicatively connected to optical communications program 206.

As discussed herein, optical communications program 206 may control optical communications system 102 to accommodate various thermal parameters, changes in bandwidth demand, etc. System quality model 230 may in turn include multiple layers of models, each including one or more adjustable mathematical relationships, logical determinations, etc., through any currently-known or later developed analytical technique for predicting an outcome based on raw data. Optical communications program 206 may read and/or receive various forms of data from system quality model 230 (e.g., specification requirement(s) 232, safety threshold(s) 234, system quality metric(s) 236) as inputs to affect the operation of optical communications system 102 as discussed herein. Example processes executed with optical communications program 206 are discussed in detail elsewhere herein. Modules 222 of control system 220 may implement one or more mathematical calculations and/or processes, e.g., use and/or modify various forms of data in system quality model 230.

Where computer system 202 comprises multiple computing devices, each computing device may have only a portion of optical communications program 206, control system 220, and/or corresponding sub-features fixed thereon (e.g., one or more modules 222, portions of system quality model 230, etc.). However, it is understood that computer system 202 and control system 220 are only representative of various possible equivalent computer systems that may perform a process described herein. Computer system 202 may obtain or provide data, such as data stored in memory 212 or storage system 214, using any solution. For example, computer system 202 may generate and/or be used to generate data from one or more data stores, receive data from another system, send data to another system, etc.

Figure 3:
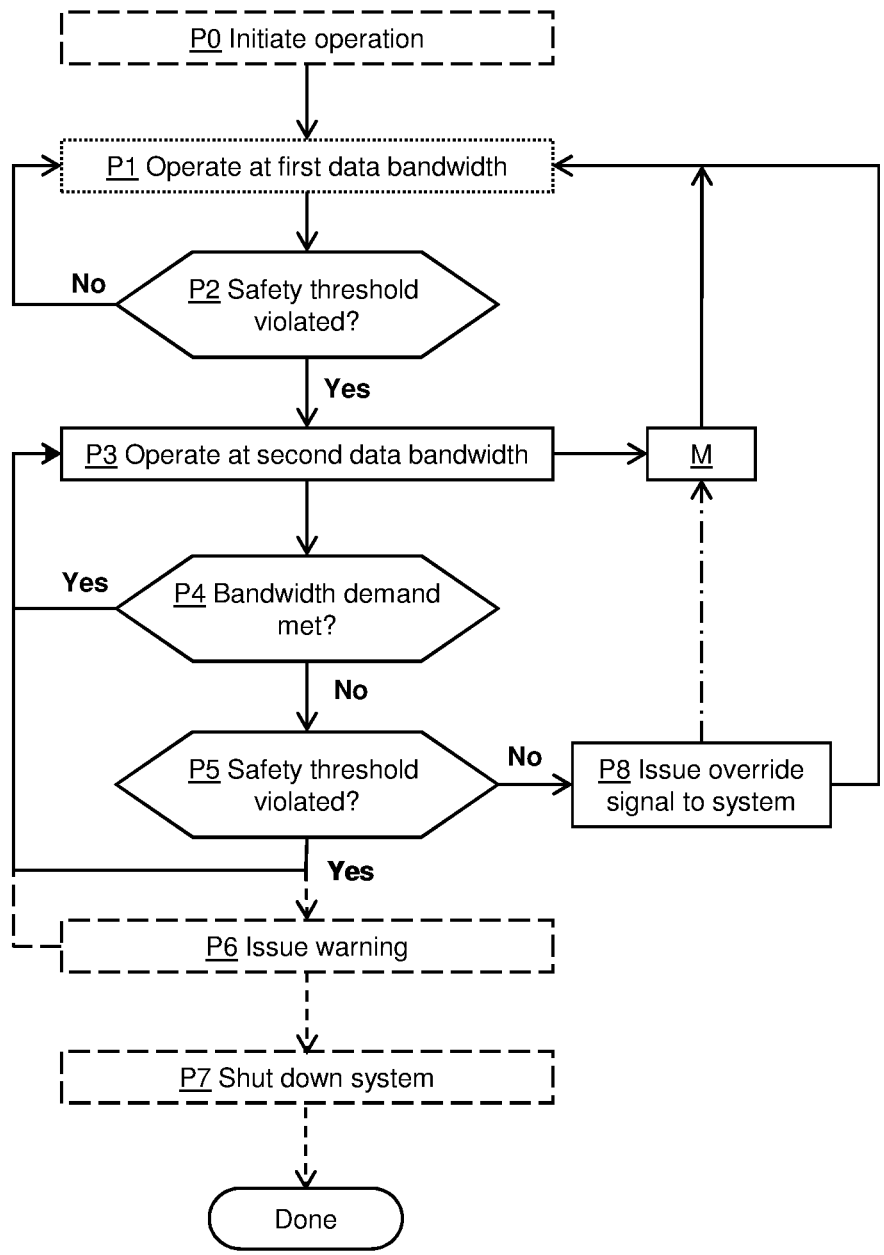
FIG. 3 is an example flow diagram of a method for controlling the bandwidth of an optical communications system according to embodiments of the disclosure.

Referring to FIGS. 2-3 together, processes for controlling optical communications system 102 are discussed. The various processes depicted in FIG. 3 may be implemented, e.g., with one or more modules 222 of control system 220, by reference to thermal threshold(s) 224, bandwidth schedule 226, data within system quality model 230, and/or other components of computer system 202 described herein by example. In this manner, methods according to the disclosure may include and/or refer to steps for adjusting the data bandwidth to accommodate changes, for example, in temperature and/or bandwidth demand. The present disclosure may be implemented with respect to one optical communications system 102 or multiple optical communications systems 102 simultaneously and/or sequentially, with each optical communications system 102 including VCSEL transmitters 10 in any conceivable number, etc., and that other examples are discussed herein where appropriate.

In a preliminary action designated as process P0, optical communications program 206 or a user thereof may initiate operation of optical communications system 102. Initiating the operation of optical communications system 102 in process P0 may include, e.g., powering on optical communications system 102 from a powered-off or dormant state, placing optical communications program 206 in communication with active optical communications system(s) 102, and/or other processes which permit adjusting of optical communications system 102 according to the present disclosure. It is understood that initiating the operation of optical communications system 102 may occur with or without the use of optical communications program 206 in embodiments of the present disclosure, and that process P0 to initiate operation of optical communications system 102 may proceed independently or by an independent entity relative to the other processes discussed by example herein.

The present disclosure may include, at process P1, operating optical communications system 102 at a first data bandwidth. The first data bandwidth may alternatively be known or identified as an "initial data bandwidth," "baseline data bandwidth," "fast data bandwidth," "default data bandwidth," etc., which may be defined in data bandwidth schedule 226. However identified, the first data bandwidth of optical communications system 102 may be a predetermined operating speed (measured, e.g., in bits per second) for accommodating a particular operating setting, e.g., peak demand, routine operation, average operating demand, etc. In the example of a networking center for an enterprise, the first data bandwidth for optical communications system 102 may correspond with operation during typical business hours and days for a particular industry (e.g., weekdays between the hours of 8 AM and 5 PM).

For a variety of reasons, operating optical communications system 102 at the first data bandwidth at process P1 may occasionally cause, for example, spikes in the operating temperature and/or other thermal parameters of hardware components in optical communications system 102. As noted elsewhere herein, it may be not be preferable or technically feasible to cut power to VCSEL transmitters 10 when one or more VCSEL transmitters 10 are not in use. Although cooling systems of optical communications system 102 may alleviate such concerns, temperature or other metrics may nevertheless occasionally violate a specification for optical communications system 102 and/or its site of implementation. To further address these situations, embodiments of the disclosure may include determining in process P2 whether one or more thermal parameters of optical communications system 102 violate thermal threshold(s) 224. Modules 222 of control system 220 may determine in process P2 whether thermal threshold(s) 224 have been violated, e.g., by comparing temperature readings from temperature sensor(s) 120 with thermal threshold(s) 224 in memory 212. In alternative embodiments, modules 222 of control system 220 may compare one or more temperature readings, or other thermal parameters, with corresponding threshold values for such parameters, defined as thermal threshold(s) 224 in memory 212. It is also understood that the determining in process P2 may include simultaneously comparing measurements by temperature sensor(s) 120 and inferential parameters of system quality model 230 with corresponding thermal threshold(s) 224.

Determining whether thermal parameters violate thermal threshold(s) 224 in process P2 may cause differences in continued operation to maintain satisfactory operation of optical communications system 102. Specifically, the present disclosure may include actions for reducing thermal parameters of optical communications system 102 when they violate predetermined thermal thresholds 224. Various implementations for determining whether thermal parameters of optical communications system 102 violate thermal threshold(s) 224 are discussed elsewhere herein relative to FIG. 5. Where modules 222 of control system 220 determine that the thermal parameter(s) under analysis do not violate thermal threshold(s) 224 (i.e., "No" at process P2), the method flow returns to process P1, and optical communications system 102 resumes operating at the first data bandwidth. Thereafter, bandwidth control system may proceed to process P2 and again determine after a predetermined time (e.g., several seconds, minutes, hours, etc.) whether thermal parameters of optical communications system 102 violate thermal threshold 224. In the case that thermal parameter(s) under analysis violate the thermal threshold (i.e., "Yes" at process P2), the flow may proceed to process P3 of operating optical communications system 102 at a second data bandwidth with a different bandwidth from the first data bandwidth. In some cases, the second data bandwidth may be lower than the first data bandwidth or vice versa. Using the case of the second data bandwidth being lower than the first data bandwidth as an example, the second data bandwidth may alternatively be identified in relative terms as a "reduced data bandwidth," "recovery data bandwidth," "slow data bandwidth," "alternative data bandwidth," "adjusted data bandwidth," etc., and in any case may be defined within data bandwidth schedule 226.

According to an embodiment, operating optical communications system 102 at the second data bandwidth in process P3 may include operating optical communications system 102 at a data bandwidth that is less than the first data bandwidth of process P1. According to one example, the second data bandwidth of process P3 may include a data bandwidth of, e.g., any bandwidth in (bits per second) greater than zero percent of the first data bandwidth and less than one-hundred percent of the first data bandwidth. The second data bandwidth of process P3 may alternatively be defined as any data bandwidth different from the first data bandwidth which causes a reduction in the thermal parameter(s) of optical communications system 102 used for the determination at process P2. To adjust the data bandwidth of optical communications system 102 in process P3, the disclosure may include adjusting control node(s) 110 of optical communications system 102 with modules 222 of control system 220, and thereby cause optical communications system 102 to continue operating at the second data bandwidth.

Figure 4:
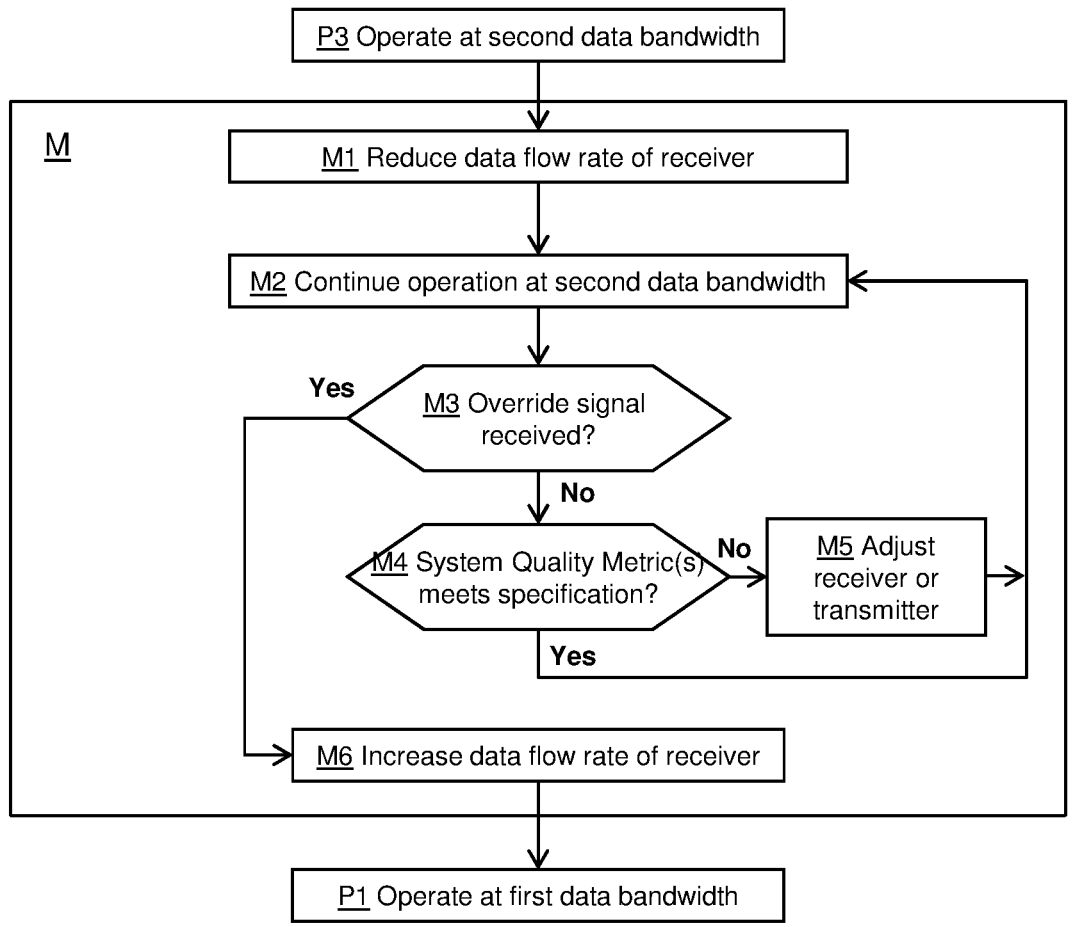
FIG. 4 is an example flow diagram of a method for controlling the optical communications system during operation at a second data bandwidth according to embodiments of the disclosure.
Figure 5:
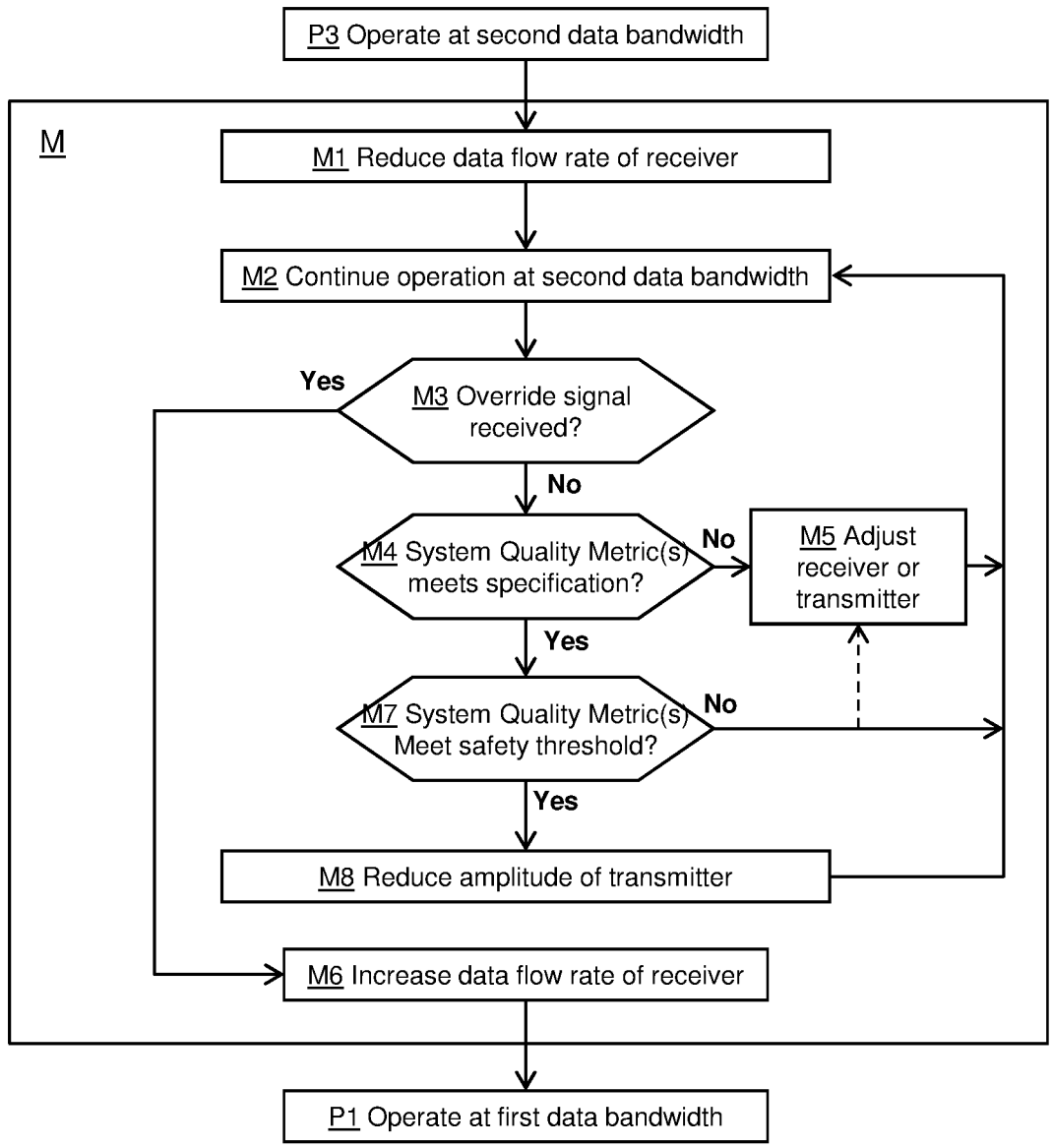
FIG. 5 is an example flow diagram of a method for controlling the optical communications system during operation at a second data bandwidth according to further embodiments of the disclosure.

Concurrently with subsequent processes (P4, P5, P6, P7 discussed herein), the disclosure may include simultaneously executing a method M to control the operational settings of VCSEL transmitter(s) 10 and receiver(s) 50. Method M may control optical communications system 102 to improve the performance of VCSEL transmitter(s) 10 and receiver(s) 50 during operation at the second data bandwidth. Example methodologies for implementing method M are shown in FIGS. 4 and 5 and discussed in further detail elsewhere herein.

Further operations of optical communications system 102 and optical communications program 206 may include continuing to operate optical communications system 102 at the second data bandwidth while providing further analysis and adjustment. As noted herein, operating optical communications system 102 at the second data bandwidth may help to reduce the thermal parameter(s) analyzed in process P2. Reducing the data bandwidth of optical communications system 102 may also reduce the amount of power drawn by VCSEL transmitters 10 and their associated thermal output, thereby reducing the temperature of optical communications system 102. Notwithstanding these improvements to thermal stability during operation at the second data bandwidth, operational demand and/or other circumstances may cause the second data bandwidth to be less than the current bandwidth demand on optical communications system 102.

To account for shortfalls in bandwidth, the flow may proceed to process P4 of determining whether continued operation of optical communications system 102 meets an identified amount of bandwidth demand (e.g., bandwidth demand 232 in system quality model 230) on optical communications system 102. Modules 222 of control system 220 thus may mathematically determine, e.g., based on direct comparison and/or computation, whether continued operation of optical communications system 102 meets the desired bandwidth (e.g., bits per second) for current system operations. In the event that continued operation of optical communications system 102 at the second data bandwidth meets a bandwidth demand on optical communications system 102, the flow may return to process P3 of continuing to operate optical communications system 102 at the second data bandwidth for a predetermined amount of time (e.g., a span of seconds, minutes, hours, etc.), before returning to process P4. Thus, embodiments of the disclosure may provide continued operation of optical communications system 102 at the second data bandwidth even after thermal parameters drop below thermal threshold 224, e.g., to reduce the risk of violating thermal threshold 224 when operation at a lower bandwidth is possible.

Although operating at the second data bandwidth in process P3 may maintain thermal parameters of optical communications system 102 below thermal threshold 224, the bandwidth demand on optical communications system 102 may specify a data bandwidth greater than the second data bandwidth defined, e.g., in data bandwidth schedule 226. Where modules 222 of control system 220 determine that bandwidth demand 232 is not met (i.e., "No" at process P4), the process flow may continue to process P5 of again determining whether thermal threshold 224 is violated. In contrast to the determining in process P2 during operation at the first data bandwidth, the determining in process P5 may occur during operation of optical communications system 102 at the second data bandwidth. In cases where the thermal parameter(s), e.g., temperature, of optical communications system 102 have returned to below the thermal threshold (i.e., "No" at process P5), modules 222 of control system 220 may resume operation of optical communications system 102 at the first data bandwidth. As shown, modules 222 may cause control node(s) 110 of optical communications system 102 to issue an override signal to optical communications system 102. More specifically, modules 222 of control system 220 may adjust control node(s) 110 of optical communications system 102 to resume operation at the first data bandwidth defined in data bandwidth schedule 226. As discussed elsewhere herein, the parallel operations of method M may terminate upon the issuing of an override signal in process P8 before optical communications system 102 resumes operation at the first data bandwidth.

In situations where the thermal parameter(s) of optical communications system 102 violate thermal threshold 224 despite continued operation at the second data bandwidth (i.e., "Yes" at process P5) optical communications system 102 may continue to operate at the second data bandwidth. The disclosure may additionally or alternatively account for any continued operation above thermal threshold 224. At process P6, one or more modules 222 of control system 220 may optionally issue a warning to user(s) of optical communications program 206 (e.g., operators of computer system 202 through I/O device 216) that the analyzed thermal parameter(s) of optical communications system 102 continue to violate thermal threshold 224. The range of processing effects and/or technical consequences of violating thermal threshold 224 during operation at the second data bandwidth may vary between optical communications systems 102, implementation settings, industries, etc. In some cases, e.g., where operation at the second data bandwidth will eventually return the thermal parameter(s) to below thermal threshold 224, the present disclosure may include continuing to operate optical communications system 102 at the second data bandwidth (e.g., at process P3) for a predetermined time before repeating the determination of processes P4, P5.

In other situations which may pose a significant operational risk, e.g., implementations with higher thermal sensitivity, the methodology may include further operations. In the case of a "Yes" determinations at process P5, for example, the method may optionally include continuing to process P7 in which optical communications program 206 shuts down optical communications system 102, e.g., by adjusting control modes 110 to cease all further operation. It is further understood that processes P6 and P7 may be implemented as a single response to a "Yes" determination at process P5, e.g., such that shutting down optical communications system 102 coincides with issuing the warning that thermal threshold 224 is violated. The flow may then conclude ("Done") to permit a user, technician, system, etc., to service optical communications system 102 and/or otherwise compensate for past operation above thermal threshold 224.

Referring now to FIGS. 2 and 4 together, further embodiments of the disclosure include one or more processes, i.e., embodiments of method M, for controlling optical communications system 102 during operation at its second data bandwidth. Method M may further reduce power consumption during operation of optical communications system 102 at a reduced data bandwidth, e.g., to meet a targeted reduction in power consumption. In this context, power consumption refers to the amount of electrical power consumed by receiver 50 during the operation of optical communications system 102 at a particular data bandwidth, and may be measured in millwatts (mW). Alternatively, power consumption may be measured in by related units such as power acceleration (mW per unit of time), percentage of a target power consumption at the first or second data bandwidth, etc. It is understood that embodiments of method M and the underlying processes thereof may be implemented in parallel with the methodology shown in FIG. 3 and described elsewhere herein. In particular, method M may be implemented on a continuous basis during operation of optical communications system 102 at the second data bandwidth, and in parallel with other steps discussed herein for managing data flow during operation of optical communications system 102 at the second data bandwidth. The issuing of an override signal in process P8 (FIG. 3) may terminate method M and resume operation of optical communications system 102 at the first data bandwidth as discussed above.

Following operation of optical communications system 102 at the second data bandwidth in process P2, method M may include a first step M1 of reducing a data flow rate of receiver 50 as optical communications system 102 continues operating at the second data bandwidth. As noted elsewhere herein, receiver(s) 50 may be electrically coupled to adjustable TIA(s) 140. TIA(s) 140 may be configured for a user to adjust the data flow rate (e.g., in bits per second) by changing the ratio between output voltage and input current across TIA(s) 140. At step M1, modules 222 of control system 220 may signal control node(s) 110 to reduce the data flow rate of receiver 50 due to the reduction in data bandwidth. The reducing of data flow rate may be provided, e.g., by increasing the resistance of TIA(s) 140 and thus increasing the ratio between output voltage and input current. Reducing the data flow rate of receiver 50 may also provide further advantages, e.g., reducing the signal noise at receiver 50 during continued operation.

Method M may proceed to step M2 of continuing operation of optical communications system 102 at the second data bandwidth, after the data flow rate of receiver 50 has been reduced in step M1. The continued operation with a reduced data flow rate may continue to offer technical advantages, e.g., reduced signal noise, power consumption etc., accompanying the existing benefits of operating optical communication system 102 at a lower data bandwidth. Method M may include additional steps to monitor for changes in data bandwidth and/or seeking further reductions to noise, power consumption, etc. At step M3, modules 222 of control system 220 may determine whether external factors (e.g., heightened temperatures and/or bandwidth demand) require optical communications system to resume operating at the first data bandwidth. Optical communications program 206 may signal a return to the first data bandwidth via an override signal to control node(s) 110 as discussed elsewhere herein.

In the event that no override signal is received (i.e., "No" at step M3), method M may continue to determining whether system quality metric(s) 236 of optical communications system 102 meet specification requirement(s) 232. It is possible for the reduced data flow rate of receiver 50 to inadvertently cause optical communications system 102 to be non-compliant with other operational requirements, e.g., by reducing the data flow rate beyond what is acceptable for low-bandwidth operations. To account for this possibility, modules 222 may determine in step M4 whether system quality metric(s) 236 meet specification requirement(s) 232 during the continued operation at the second data bandwidth. Where system quality metric(s) 236 meet specification requirement(s) 232 (i.e., "Yes" at step M4), method M may return to step M2 of continuing operation at the second data bandwidth. In the event that modules 222 determine that system quality metric(s) 236 do not meet specification requirement(s) 232 (i.e., "No" at step M4), control system 220 may implement one or more corrective actions in step M5.

According to an example, specification requirement(s) 232 may define a target bit error rate as being no more than $1.0 \times 10^{-12}$ errors per second. If adjusting the data flow rate of receiver 50 causes the total number of errors in a signal exceeds this amount (e.g., $1.0 \times 10^{-11}$ errors per second), optical communications system 102 violates specification requirement(s) 232. In the event that reducing the data flow rate causes the bit error rate to violate specification requirement 232, method M may include correcting the violations. Method M may include step M5 of adjusting VCSEL transmitter 10 and/or receiver 50 to return system quality metric(s) 236 to an acceptable level. For instance, control system 220 may adjust TIA(s) 140 via control node 110, e.g., by decreasing the resistance of TIA 140 and thus increase the data flow rate of transmitter 50. Additionally or alternatively, VCSEL transmitter 10 and/or other components of optical communications system 102 may be adjusted so that system quality metric(s) 236 meet specification requirement(s) 232. For instance, control system 220 may decrease the optical modulation amplitude of VCSEL transmitter 10 to accommodate the prior reduction in data flow rate of receiver 50 in step M2. In still further embodiments, VCSEL transmitter 10, receiver 50 and/or other components of optical communication system may be adjusted together so that system quality metric(s) 232 meet specification requirement(s) 236. The adjusted characteristics of VCSEL transmitter 10 and/or receiver 50, e.g., TIA resistance, optical modulation amplitude, etc., may be denoted as "operational settings" of VCSEL transmitter 10 and/or receiver 50.

Compliance with specification requirement(s) 232 may be based on other performance metrics. For example, specification requirement(s) 232 may define a target power consumption for receiver 50 during operation at the second data bandwidth. Further reductions in data flow rate may not be desired and/or necessary when this target is met. According to an example, the reducing of data flow rate of receiver 50 may inadvertently reduce the power consumption of optical communications system (e.g., in milliwatts (mW)) to the target amount defined in specification requirement 232. In this case, the flow may bypass step M5 while signaling control node 110 to prevent any further reduction in data flow rate at receiver 50, e.g., to maintain the target power consumption, such that optical communications system 102 continues to meet specification requirement(s) 232. Following step M5, method M returns to step M2 of continuing the operation of optical communications system 102 at the second data bandwidth. The method may then return to step M3 of monitoring for an override signal.

Upon receiving an override signal to resume operation at the first data bandwidth (i.e., "Yes" at step M3), method M proceeds to step M6 of increasing the data flow rate of receiver(s) 50 to its original level. Increasing the data flow rate at step M6 may include, e.g., reversing the change to receiver(s) 50 at step M1. More specifically, modules 222 of control system 220 may decrease the resistance of adjustable TIA 140 to restore the original data rate of receiver(s) 50, and thus may also increase the amount of signal noise at receiver 50. At this point, method M concludes and optical communications program 206 resumes operating optical communication system 102 at the first data bandwidth, e.g., based on bandwidth schedule 226. It is possible for method M to be repeated in a subsequent operating of optical communications system 102 at the second data bandwidth.

Referring now to FIGS. 2 and 5, further embodiments of method M include steps to continue adjusting VCSEL transmitter(s) 10 and receiver(s) 50 during operation at the second data bandwidth. The additional steps may be implemented together or separately based on a particular product, field of deployment, operational needs, etc. Steps M1-M6 of method M may be implemented similarly or identically to other embodiments of method M as discussed herein, apart from interactions with the optional changes shown in FIG. 5 and discussed herein. The embodiment of method M shown in FIG. 5 includes comparing system quality metric(s) 236 with safety threshold(s) 234 at step M7. At step M7, modules 222 of control 220 may determine whether system quality metric(s) 236 meet safety threshold(s) 234 of system quality model 230. The determining at step M7 is conditioned on system quality metric(s) 236 previously meeting specification requirement(s) 232 in step M4. In the event that system quality metric(s) 236 does not meet safety threshold(s) 234 (i.e., "No" at step M7) the method may return to step M2 of continuing to operate at the second data bandwidth without further changes to the operational setting(s) of VCSEL transmitter 10 and/or receiver 50. The method may optionally proceed to step M5 before continuing to step M2, e.g., to further adjust operational settings of VCSEL transmitter 10 and/or receiver 50. It may be desirable to further adjust VCEL transmitter 10 and/or receiver 50 when safety threshold(s) 234 are not met. For example, proceeding to step M5 may further reduce the risk of failing to comply with specification requirement(s) 232 and/or safety threshold(s) 234.

The embodiment of method M illustrated in FIG. 5 may include additional processes for avoiding non-compliance with specification requirement(s) 232. In the event that system quality metric(s) 236 meet specification requirement(s) 232 and safety threshold(s) 234 (i.e., "Yes" at step M7), it may be possible to adjust VCSEL transmitter 10 to obtain further operational benefits (e.g., reductions in signal noise or data flow rate). At step M8, control system 220 may reduce the optical modulation amplitude of VCSEL transmitter 10 to further reduce the data flow rate, signal noise, etc., of optical communications system 102 during operation at the second data bandwidth. Reducing the optical modulation amplitude of VCSEL transmitter 10 thus may increase the advantages of continuing to operate optical communications system 102 at the second data bandwidth. Method M may then proceed to step M2 of continuing the operation of optical communications system 102 at the second data bandwidth. In a subsequent determining at step M7, the optical modulation amplitude of VCSEL transmitter 10 may be further reduced or held at its current value based on whether system quality metric(s) 236 continue to meet safety threshold(s) 234.

As will be appreciated by one skilled in the art, aspects of the present disclosure may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module," or "system." Furthermore, aspects of the present disclosure may take the form of a computer program product embodied in one or more computer readable medium(s) having computer readable program code embodied thereon.

Any combination of one or more computer readable medium(s) may be used. A computer readable storage medium may be, for example, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that may contain, or store a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, may be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that may direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowcharts and block diagrams in the Figures illustrate the layout, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, may be implemented by special purpose hardware-based systems that perform the specified functions or acts, or combinations of special purpose hardware and computer instructions.

As used herein, the term "configured," "configured to" and/or "configured for" may refer to specific-purpose patterns of the component so described. For example, a system or device configured to perform a function may include a computer system or computing device programmed or otherwise modified to perform that specific function. In other cases, program code stored on a computer-readable medium (e.g., storage medium), may be configured to cause at least one computing device to perform functions when that program code is executed on that computing device. In these cases, the arrangement of the program code triggers specific functions in the computing device upon execution. In other examples, a device configured to interact with and/or act upon other components may be specifically shaped and/or designed to effectively interact with and/or act upon those components. In some such circumstances, the device is configured to interact with another component because at least a portion of its shape complements at least a portion of the shape of that other component. In some circumstances, at least a portion of the device is sized to interact with at least a portion of that other component. The physical relationship (e.g., complementary, size-coincident, etc.) between the device and the other component may aid in performing a function, for example, displacement of one or more of the device or other component, engagement of one or more of the device or other component, etc.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for controlling an optical communications system operating at a first data bandwidth, the optical communications system having a vertical cavity surface emitting laser (VCSEL) transmitter and a receiver for detecting lasers from the VCSEL transmitter, the method comprising:
    adjusting the VCSEL transmitter of the optical communications system to operate at a second data bandwidth distinct from the first data bandwidth;
    reducing a data flow rate of the receiver during operation of the optical communications system at the second data bandwidth;
    determining whether a system quality metric for the receiver meets a specification requirement during operation of the optical communications system at the second data bandwidth, wherein the system quality metric comprises one of a bit error rate of the receiver, a power consumption of the receiver, or an optical modulation amplitude of the VCSEL transmitter;
    in response to determining the system quality metric does not meet the specification requirement, adjusting an operational setting of the VCSEL transmitter or the receiver;
    in response to determining the system quality metric meets the specification requirement, continuing operation of the optical communications system at the second data bandwidth; and
    in response to receiving an override signal from a control node of the optical communications system, resuming operation of the optical communications system at the first data bandwidth.

2. The method of claim 1, wherein the system quality metric includes the bit error rate of the receiver and the power consumption of the receiver.

3. The method of claim 1, wherein the operational setting of the VCSEL transmitter comprises an optical modulation amplitude, and wherein adjusting the operational setting includes decreasing the optical modulation amplitude.

4. The method of claim 1, wherein the receiver includes an adjustable transimpedance amplifier, and wherein adjusting the operational setting includes decreasing the resistance of the transmipedance amplifier.

5. The method of claim 1, wherein the receiver includes an adjustable transimpedance amplifier, and wherein adjusting the operational setting includes increasing a resistance of the adjustable transimpedance amplifier of the receiver to reduce a noise level at the receiver.

6. The method of claim 1, further comprising:
    in response to the system quality metric meeting the specification requirement, determining whether the system quality metric meeting a predetermined safety threshold;
    in response to the system quality metric meeting the predetermined safety threshold, reducing an optical modulation amplitude of the VCSEL transmitter and continuing operation of the optical communications system at the second data bandwidth; and
    in response to the system quality metric not meeting the predetermined safety threshold, continuing operation of the optical communications system at the second data bandwidth.

7. The method of claim 6, further comprising, in response to the system quality metric not meeting the predetermined safety threshold, adjusting an operational setting of the VCSEL transmitter or the receiver.

8. A computer program product stored on a non-transitory computer readable storage medium, the computer program product comprising program code, which, when being executed by at least one computing device, causes the at least one computing device to:
    operate an optical communications system at a first data bandwidth, the optical communications system having a vertical cavity surface emitting laser (VCSEL) transmitter and a receiver for detecting lasers from the VCSEL transmitter;
    adjust the VCSEL transmitter of the optical communications system to operate at a second data bandwidth distinct from the first data bandwidth;
    reduce a data flow rate of the receiver during operation of the optical communications system at the second data bandwidth;
    determine whether a system quality metric for the receiver meets a specification requirement during operation of the optical communications system at the second data bandwidth, wherein the system quality metric comprises one of a bit error rate of the receiver, a power consumption of the receiver, or an optical modulation amplitude of the VCSEL transmitter;

in response to determining the system quality metric does not meet the specification requirement, adjusting an operational setting of the VCSEL transmitter or the receiver;

in response to determining the system quality metric meets the specification requirement, continuing operation of the optical communications system at the second data bandwidth; and in response to receiving an override signal from a control node of the optical communications system, resuming operation of the optical communications system at the first data bandwidth.

9. The computer program product of claim 8, wherein the system quality metric includes the bit error rate of the receiver and the power consumption of the receiver.

10. The computer program product of claim 8, wherein the operational setting of the VCSEL transmitter comprises an optical modulation amplitude, and wherein adjusting the operational setting includes decreasing the optical modulation amplitude.

11. The computer program product of claim 8, wherein the receiver includes an adjustable transimpedance amplifier, and wherein adjusting the operational setting includes decreasing the resistance of the transmipedance amplifier.

12. The computer program product of claim 8, wherein the receiver includes an adjustable transimpedance amplifier, and wherein adjusting the operational setting of the receiver includes increasing a resistance of the adjustable transimpedance amplifier of the receiver to reduce a noise level at the receiver.

13. The computer program product of claim 8, further comprising program code for causing the at least one computing device to perform actions including:

in response to the system quality metric meeting the specification requirement, determining whether the system quality metric meets a predetermined safety threshold;

in response to the system quality metric meeting the predetermined safety threshold, reducing an optical modulation amplitude of the VCSEL transmitter and continuing operation of the optical communications system at the second data bandwidth; and in response to the system quality metric not meeting the predetermined safety threshold, continuing operation of the optical communications system at the second data bandwidth.

14. The computer program product of claim 13, further comprising program code for causing the at least one computing device to perform actions including, in response to the system quality metric not meeting the predetermined safety threshold, adjusting an operational setting of the VCSEL transmitter or the receiver.

15. A system comprising at least one computing device configured to perform a method for controlling an optical communications system operating at a first data bandwidth, the optical communications system having a vertical cavity surface emitting laser (VCSEL) transmitter and a receiver for detecting lasers from the VCSEL transmitter, by performing actions including:

adjusting the VCSEL transmitter of the optical communications system to operate at a second data bandwidth distinct from the first data bandwidth;

reducing a data flow rate of the receiver during operation of the optical communications system at the second data bandwidth;

determining whether a system quality metric for the receiver meets a specification requirement during operation of the optical communications system at the second data bandwidth, wherein the system quality metric comprises one of a bit error rate of the receiver, a power consumption of the receiver, or an optical modulation amplitude of the VCSEL transmitter;

in response to determining the system quality metric does not meet the specification requirement, adjusting an operational setting of the VCSEL transmitter or the receiver;

in response to determining the system quality metric meets the specification requirement, continuing operation of the optical communications system at the second data bandwidth; and in response to receiving an override signal from a control node of the optical communications system, resuming operation of the optical communications system at the first data bandwidth.

16. The system of claim 15, wherein the system quality metric includes the bit error rate of the receiver and the power consumption of the receiver.

17. The system of claim 15, wherein the operational setting of the VCSEL transmitter comprises an optical modulation amplitude, and wherein adjusting the operational setting includes decreasing the optical modulation amplitude.

18. The system of claim 15, wherein the receiver includes an adjustable transimpedance amplifier, and wherein adjusting the operational setting includes decreasing the resistance of the transmipedance amplifier.

19. The system of claim 15, wherein the receiver includes an adjustable transimpedance amplifier, and wherein adjusting the operational setting of the receiver includes increasing a resistance of the adjustable transimpedance amplifier of the receiver to reduce a noise level at the receiver.

20. The system of claim 15, wherein the method further includes:

in response to the system quality metric meeting the specification requirement, determining whether the system quality metric meets a predetermined safety threshold;

in response to the system quality metric meeting the predetermined safety threshold, reducing an optical modulation amplitude of the VCSEL transmitter and continuing operation of the optical communications system at the second data bandwidth;

in response to the system quality metric not meeting the predetermined safety threshold, adjusting an operational setting of the VCSEL transmitter or the receiver and continuing operation of the optical communications system at the second data bandwidth.

* * * * *